United States Patent
Sheelavant

(10) Patent No.: US 10,041,842 B2
(45) Date of Patent: Aug. 7, 2018

(54) METHOD FOR MEASURING TEMPERATURE BY REFRACTION AND CHANGE IN VELOCITY OF WAVES WITH MAGNETIC SUSCEPTIBILITY

(71) Applicant: Applied Materials, Inc., Santa Clara, CA (US)

(72) Inventor: Gangadhar Sheelavant, Karnataka (IN)

(73) Assignee: Applied Materials, Inc., Santa Clara, CA (US)

( * ) Notice: Subject to any disclaimer, the term of this patent is extended or adjusted under 35 U.S.C. 154(b) by 525 days.

(21) Appl. No.: 14/534,563

(22) Filed: Nov. 6, 2014

(65) Prior Publication Data

US 2016/0131539 A1    May 12, 2016

(51) Int. Cl.
| | | |
|---|---|---|
| *G01K 11/00* | (2006.01) | |
| *G01K 11/30* | (2006.01) | |
| *G01K 11/12* | (2006.01) | |
| *H01L 21/67* | (2006.01) | |
| *G01J 5/00* | (2006.01) | |

(Continued)

(52) U.S. Cl.
CPC ...... *G01K 11/006* (2013.01); *H01L 21/67248* (2013.01); *F27D 21/0014* (2013.01); *G01J 5/0003* (2013.01); *G01K 11/12* (2013.01); *G01K 11/30* (2013.01); *G01R 31/2656* (2013.01)

(58) Field of Classification Search
CPC .... G01K 11/006; G01K 17/003; G01K 11/30; G01K 11/125; G01K 11/12; G01K 11/00; G01J 2005/0081; G01J 5/00; G01J 5/0003; G01V 8/12; G01R 31/2656; F27D 21/0014; H01L 21/67248
See application file for complete search history.

(56) References Cited

U.S. PATENT DOCUMENTS

| | | | | |
|---|---|---|---|---|
| 4,072,055 A | * | 2/1978 | Elliott | G01K 11/12 374/159 |
| 4,201,446 A | * | 5/1980 | Geddes | G02B 6/032 356/44 |

(Continued)

FOREIGN PATENT DOCUMENTS

| | | |
|---|---|---|
| CN | 1602371 A | 3/2005 |
| CN | 100339731 C | 9/2007 |

(Continued)

OTHER PUBLICATIONS

"Radio waves measure atmospheric temperature changes" article from webpage: http://physicsworld.com/cws/article/news/2013/aug/06/radio-waves-measure-atmospheric-temperature-changes.

(Continued)

*Primary Examiner* — Randy Gibson
(74) *Attorney, Agent, or Firm* — Patterson + Sheridan, LLP

(57) ABSTRACT

Methods and apparatuses for determining in-situ a temperature of a substrate with a thermal sensor in a vacuum chamber are described herein. In one embodiment a thermal sensor has a transmitter configured to transmit electromagnetic waves, a receiver configured to receive electromagnetic waves, and a controller configured to control the transmitter and receiver, wherein the controller determines a temperature from a difference between the transmitted electromagnetic wave and the received electromagnetic wave.

8 Claims, 2 Drawing Sheets

(51) Int. Cl.
*G01R 31/265* (2006.01)
*F27D 21/00* (2006.01)

(56) References Cited

U.S. PATENT DOCUMENTS

| | | | | |
|---|---|---|---|---|
| 4,215,576 A * | 8/1980 | Quick | | G01K 11/12 |
| | | | | 356/365 |
| 4,756,627 A * | 7/1988 | Nelson | | G01K 5/52 |
| | | | | 374/159 |
| 4,839,515 A * | 6/1989 | Kershaw | | G01D 5/268 |
| | | | | 250/201.1 |
| 4,890,245 A * | 12/1989 | Yomoto | | G01J 5/0003 |
| | | | | 250/492.2 |
| 4,891,499 A * | 1/1990 | Moslehi | | F27B 17/0025 |
| | | | | 219/121.6 |
| 4,956,538 A * | 9/1990 | Moslehi | | G01J 5/0003 |
| | | | | 219/121.6 |
| 5,049,816 A | 9/1991 | Moslehi | | |
| 5,052,820 A * | 10/1991 | McGinniss | | G01K 11/00 |
| | | | | 250/227.11 |
| 5,229,303 A * | 7/1993 | Donnelly, Jr. | | G01K 11/00 |
| | | | | 204/192.13 |
| 5,258,602 A * | 11/1993 | Naselli | | G01K 11/12 |
| | | | | 219/494 |
| 5,263,776 A * | 11/1993 | Abraham | | G01K 11/00 |
| | | | | 356/45 |
| 5,377,126 A * | 12/1994 | Flik | | G01J 5/0003 |
| | | | | 374/120 |
| 5,403,433 A * | 4/1995 | Morrison | | G01J 5/0003 |
| | | | | 204/192.13 |
| 5,500,502 A * | 3/1996 | Horita | | B23K 26/032 |
| | | | | 219/121.63 |
| 5,560,712 A * | 10/1996 | Kleinerman | | G01D 5/35377 |
| | | | | 250/227.14 |
| 5,764,161 A * | 6/1998 | Schier | | G01B 11/16 |
| | | | | 340/870.16 |
| 5,820,265 A * | 10/1998 | Kleinerman | | G01D 5/35377 |
| | | | | 250/227.14 |
| 5,848,842 A * | 12/1998 | Peuse | | G01J 5/0003 |
| | | | | 374/1 |
| 6,062,729 A * | 5/2000 | Ni | | G01J 5/0003 |
| | | | | 374/121 |
| 6,090,210 A * | 7/2000 | Ballance | | C23C 16/45565 |
| | | | | 118/50.1 |
| 6,116,779 A * | 9/2000 | Johnson | | G01K 11/14 |
| | | | | 374/120 |
| 6,123,766 A * | 9/2000 | Williams | | C23C 16/46 |
| | | | | 117/202 |
| 6,184,498 B1 * | 2/2001 | Kiyama | | H01L 21/324 |
| | | | | 118/724 |
| 6,246,469 B1 * | 6/2001 | Schier | | G01B 11/16 |
| | | | | 356/5.09 |
| 6,265,696 B1 * | 7/2001 | Sakurai | | G01J 5/0003 |
| | | | | 118/724 |
| 6,304,328 B1 * | 10/2001 | Longtin | | G01K 11/12 |
| | | | | 356/445 |
| 6,395,363 B1 * | 5/2002 | Ballance | | H01L 21/687 |
| | | | | 118/500 |
| 6,483,083 B2 * | 11/2002 | Sakurai | | G01J 5/0003 |
| | | | | 118/50.1 |
| 6,770,134 B2 | 8/2004 | Maydan et al. | | |
| 6,905,542 B2 | 6/2005 | Samoilov et al. | | |
| 7,414,224 B2 * | 8/2008 | Aderhold | | F27B 17/0025 |
| | | | | 219/390 |
| 7,543,981 B2 * | 6/2009 | Timans | | G01K 11/125 |
| | | | | 250/338.1 |
| 7,626,149 B2 * | 12/2009 | Leath | | G01K 11/006 |
| | | | | 219/703 |
| 7,871,469 B2 | 1/2011 | Maydan et al. | | |
| 7,976,216 B2 * | 7/2011 | Timans | | G01K 11/125 |
| | | | | 250/338.1 |
| 8,042,996 B2 * | 10/2011 | Agronin | | G01J 5/02 |
| | | | | 374/112 |
| 8,157,439 B2 * | 4/2012 | Timans | | G01K 11/125 |
| | | | | 250/338.1 |
| 8,419,272 B2 | 4/2013 | Higashi | | |
| 8,426,770 B2 * | 4/2013 | Pinon | | B23K 26/032 |
| | | | | 219/121.64 |
| 8,430,561 B2 * | 4/2013 | Agronin | | G01J 5/02 |
| | | | | 374/121 |
| 8,543,357 B1 * | 9/2013 | Marandos | | G01J 5/0003 |
| | | | | 250/341.8 |
| 8,658,945 B2 * | 2/2014 | Aderhold | | F27B 17/0025 |
| | | | | 118/724 |
| 8,668,383 B2 * | 3/2014 | Timans | | G01K 11/125 |
| | | | | 250/338.1 |
| 8,967,860 B2 | 3/2015 | Patalay | | |
| 9,325,914 B2 * | 4/2016 | Marandos | | G01J 5/0003 |
| 9,431,278 B2 * | 8/2016 | Aderhold | | F27B 17/0025 |
| 9,568,377 B1 * | 2/2017 | Ohodnicki, Jr. | | G01K 11/12 |
| 9,677,949 B1 * | 6/2017 | Han | | G01K 11/3206 |
| 2002/0174826 A1 | 11/2002 | Maydan et al. | | |
| 2002/0174827 A1 | 11/2002 | Samoilov et al. | | |
| 2004/0052512 A1 * | 3/2004 | Aderhold | | H01L 21/67248 |
| | | | | 392/418 |
| 2004/0060917 A1 * | 4/2004 | Liu | | F27D 19/00 |
| | | | | 219/390 |
| 2004/0237883 A1 | 12/2004 | Maydan et al. | | |
| 2005/0191044 A1 * | 9/2005 | Aderhold | | F27B 17/0025 |
| | | | | 392/418 |
| 2006/0233216 A1 * | 10/2006 | Schuele | | A61B 5/0066 |
| | | | | 374/130 |
| 2007/0020784 A1 * | 1/2007 | Timans | | G01J 5/0003 |
| | | | | 438/16 |
| 2007/0104470 A1 * | 5/2007 | Aderhold | | F27B 17/0025 |
| | | | | 392/422 |
| 2009/0041443 A1 * | 2/2009 | Aderhold | | F27B 17/0025 |
| | | | | 392/411 |
| 2010/0008395 A1 * | 1/2010 | Daniel | | G01K 11/006 |
| | | | | 374/139 |
| 2010/0086006 A1 | 4/2010 | Higashi | | |
| 2010/0232470 A1 * | 9/2010 | Timans | | G01J 5/0003 |
| | | | | 374/2 |
| 2011/0150035 A1 * | 6/2011 | Hanson | | G01K 11/12 |
| | | | | 374/161 |
| 2011/0216803 A1 * | 9/2011 | Timans | | G01J 5/0003 |
| | | | | 374/1 |
| 2012/0201267 A1 | 8/2012 | Patalay | | |
| 2012/0231558 A1 * | 9/2012 | Timans | | G01J 5/0003 |
| | | | | 438/7 |
| 2013/0028286 A1 * | 1/2013 | Timans | | G01J 5/0003 |
| | | | | 374/1 |
| 2013/0130184 A1 | 5/2013 | Lu et al. | | |
| 2015/0092813 A1 * | 4/2015 | Timans | | G01J 5/0003 |
| | | | | 374/45 |
| 2015/0221535 A1 * | 8/2015 | Nguyen | | G01K 11/125 |
| | | | | 374/161 |
| 2016/0018264 A1 * | 1/2016 | Bowers | | G01V 8/005 |
| | | | | 374/122 |
| 2016/0273970 A1 * | 9/2016 | Alon | | A61B 5/055 |

FOREIGN PATENT DOCUMENTS

| | | | | |
|---|---|---|---|---|
| CN | 101218492 A | 7/2008 | | |
| CN | 101218492 B | 8/2010 | | |
| EP | 1453992 A1 | 9/2004 | | |
| EP | 1909083 A1 | 4/2008 | | |
| EP | 1909083 A4 | 12/2011 | | |
| JP | 2005-513516 A | 5/2005 | | |
| JP | 4742279 B2 | 8/2011 | | |
| KR | 2004-0066894 | * 7/2004 | | C30B 25/02 |
| KR | 2008-0031046 A | 4/2008 | | |
| KR | 10-0951305 B1 | 4/2010 | | |
| TW | 200300968 A | 6/2003 | | |
| TW | 541621 B | 7/2003 | | |
| TW | 270932 A | 11/2007 | | |
| TW | 201233988 A | 8/2012 | | |
| WO | 02-095092 A1 | 11/2002 | | |

(56) References Cited

FOREIGN PATENT DOCUMENTS

| WO | 03-050330 A1 | 6/2003 |
| WO | 2007-004644 A1 | 1/2007 |
| WO | 2012-108900 A1 | 8/2012 |

OTHER PUBLICATIONS

"New Tool Uses Radio Waves to Predict Climate Change" article from webpage: http://www.redorbit.com/news/science/1112911605/climate-change-predictions-via-radio-waves-073113/.
"Refraction of Sound Waves" article from webpage: http://www.acs.psu.edu/drussell/demos/refract/refract.html.
"Propagation of an Electromagnet Wave" article from webpage: http://www.physicsclassroom.com/mmedia/waves/em.cfm.
"Noncontact Temperature Measurement Theory and Application" article from webpage: http://www.omega.com/temperature/z/noncontacttm.html.
"Speed of Sound" article from webpage: http://ffden-2.phys.uaf.edu/212_fall2003.web.dir/dennis_jackson/speedofsound.html.
International Search Report and Written Opinion from PCT/US2015/054141 dated Jan. 22, 2016 (10 pgs.).

\* cited by examiner

METHOD FOR MEASURING TEMPERATURE BY REFRACTION AND CHANGE IN VELOCITY OF WAVES WITH MAGNETIC SUSCEPTIBILITY

FIELD

Embodiments of the invention relate to the manufacturing of semiconductor devices. More particularly, embodiments relate to measuring a temperature of semiconductor devices during manufacture.

BACKGROUND

Rapid thermal processing (or RTP) refers to a semiconductor manufacturing process which quickly heats silicon wafers to high temperatures (up to 1,200° C. or greater) on a timescale of several seconds or less. During cooling, however, wafer temperatures must be brought down slowly to prevent dislocations and wafer breakage due to thermal shock. The rapid heating rates are often attained by high intensity lamps or lasers. RTP is used for a wide variety of applications in semiconductor manufacturing including dopant activation, thermal oxidation, metal reflow and chemical vapor deposition.

Measuring the process temperature is critical for controlling the rapid heating and cooling rates in the RTP tool to prevent damage to the silicon wafers processed therein. Thus, the RPT tool requires a temperature measuring device which has a fast response, is accurate and able to measure temperatures accurately in the temperature range of about 250° C. to 1100° C. Often the ability for the RPT tool to measure the temperature of the substrate quickly and accurately at a relatively low-cost for one end of the temperature range compromises the ability to measure the temperature at the other end of the temperature range.

Therefore, there is a need for an improved temperature measuring device.

SUMMARY

Methods and apparatuses for determining in-situ a temperature of a substrate with a thermal sensor in a vacuum chamber are described herein. In one embodiment a thermal sensor has a transmitter configured to transmit electromagnetic waves, a receiver configured to receive electromagnetic waves, and a controller configured to control the transmitter and receiver, wherein the controller is operable to determine a temperature from a difference between the transmitted electromagnetic wave and the received electromagnetic wave.

In another embodiment, a processing chamber is provided. The processing chamber includes a chamber body and a substrate support disposed in an internal volume of the chamber body. A transmitter is oriented to transmit electromagnetic waves through a substrate disposed on the substrate support. A receiver is oriented to receive electromagnetic waves emitted by the transmitter. A controller is configured to control the transmitter and receiver. The controller is operable to determine a temperature from a magnetic fielded variation of the transmitted electromagnetic wave and the received electromagnetic wave.

In yet another embodiment, a method for non-contact measurement of a temperature of a substrate disposed in a processing chamber is provided. The method includes transferring a substrate into a processing chamber, directing an electromagnetic wave through the substrate disposed in the processing chamber, receiving the electromagnetic wave after having passed through the substrate, and determining a temperature of the substrate based on a metric indicative of a change between the directed electromagnetic wave and the received electromagnetic wave.

BRIEF DESCRIPTION OF THE DRAWINGS

So that the manner in which the above-recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure generally relate to an apparatus and methods for quickly measuring temperatures on a substrate undergoing processing in a chamber having rapid and extreme temperature changes. The temperature measuring device may assist in controlling the substrate temperature, so as to minimize damage due to overheating and instances of thermal shock which may damage the substrate during substrate processing. In one embodiment, the temperature control device may use radio waves diffraction to quickly and accurately measure a substrate temperature. In another embodiment, the temperature control device may use electromagnetic waves to quickly and accurately measure a substrate temperature.

Figure 1:
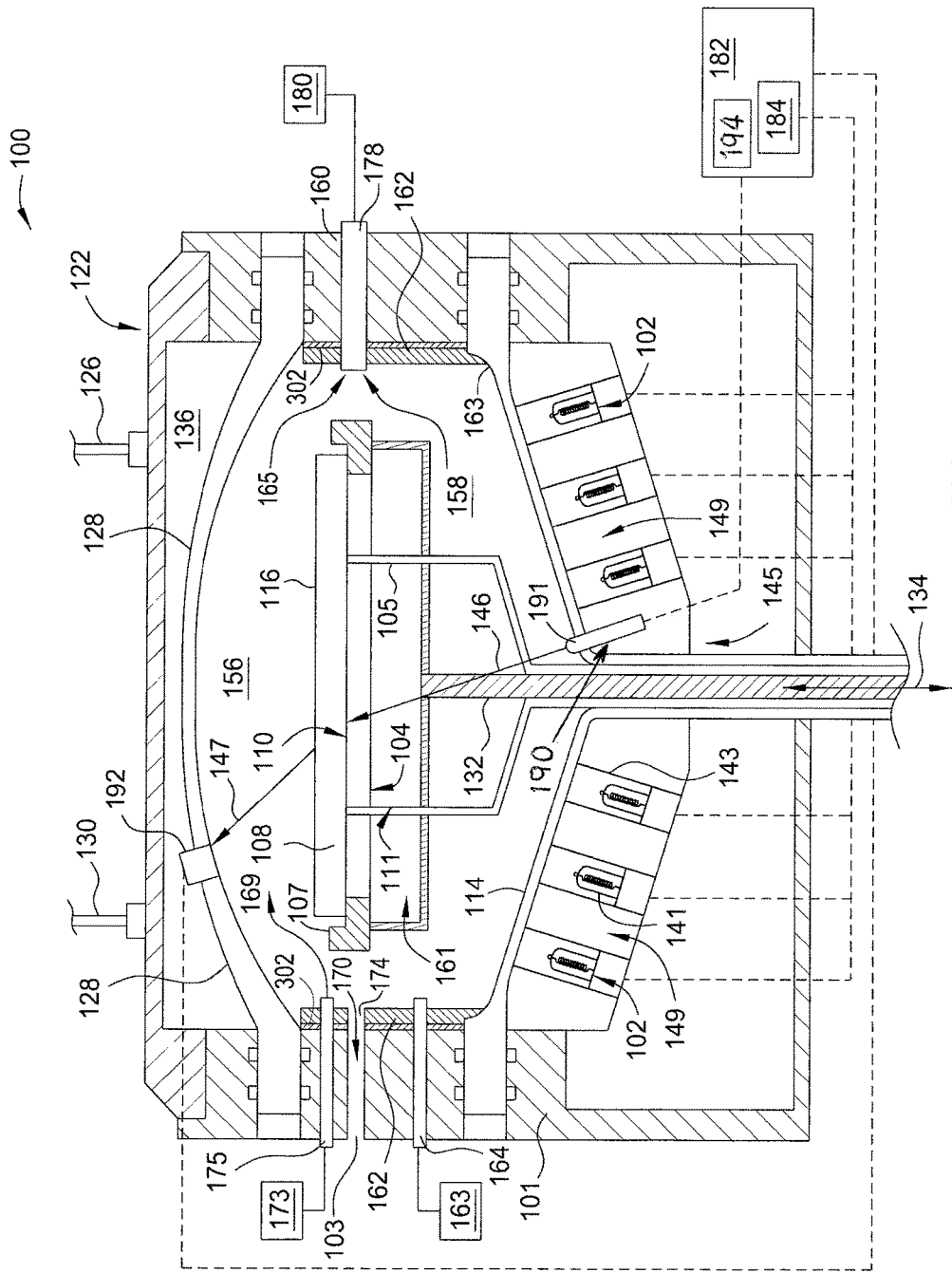
FIG. 1 is a schematic sectional view of a processing chamber having a thermal sensor.

FIG. 1 is a schematic sectional view of a processing chamber 100 having a thermal sensor 190, according to one embodiment. The processing chamber 100 may be used to process one or more substrates, including deposition of a material on an upper surface of a substrate, such as an upper surface 116 of a substrate 108 depicted in FIG. 1. The processing chamber 100 includes a chamber body 101 connected to, an upper dome 128 and a lower dome 114. In one embodiment, the upper dome 128 may be fabricated from a material such as a stainless steel, aluminum, or ceramics including quartz, including bubble quartz (e.g., quartz with fluid inclusions), alumina, yttria, or sapphire. The upper dome 128 may also be formed from coated metals or ceramics. The lower dome 114 may be formed from an optically transparent or translucent material such as quartz. The lower dome 114 is coupled to, or is an integral part of, the chamber body 101. The chamber body 101 may include a base plate 160 that supports the upper dome 128.

An array of radiant heating lamps 102 is disposed below the lower dome 114 for heating, among other components, a backside 104 of a substrate support 107 disposed within the processing chamber 100. Alternately, the array of radiant heating lamps 102 is disposed above the upper dome 128 for heating, among other components, the upper surface 116 of the substrate 108 disposed within the processing chamber 100. During deposition, the substrate 108 may be brought into the processing chamber 100 and positioned onto the substrate support 107 through a loading port 103. The lamps 102 are adapted to the heat the substrate 108 to a predetermined temperature to facilitate thermal decomposition of process gases supplied into the processing chamber to deposit a material on onto the upper surface 116 of the substrate 108. In one example, the material deposited onto the substrate 108 may be a group III, group IV, and/or group V material, or a material which includes a group III, group IV, and/or group V dopant. For example, the deposited material may be one or more of gallium arsenide, gallium nitride, or aluminum gallium nitride. The lamps 102 may be adapted to rapidly heat the substrate 108 to a temperature of about 300 degrees Celsius to about 1200 degrees Celsius, such as about 300 degrees Celsius to about 950 degrees Celsius.

The lamps 102 may include bulbs 141 surrounded by an optional reflector 143 disposed adjacent to and beneath the lower dome 114 to heat the substrate 108 as the process gas passes thereover to facilitate the deposition of the material onto the upper surface 116 of the substrate 108. The lamps 102 are arranged in annular groups of increasing radius around a shaft 132 of the substrate support 107. The shaft 132 is formed from quartz and contains a hollow portion or cavity therein, which reduces lateral displacement of radiant energy near the center of the substrate 108, thus facilitating uniform irradiation of the substrate 108.

In one embodiment, each lamp 102 is coupled to a power distribution board (not shown) through which power is supplied to each lamp 102. The lamps 102 are positioned within a lamphead 145 which may be cooled during or after processing by, for example, a cooling fluid introduced into channels 149 located between the lamps 102. The lamphead 145 conductively cools the lower dome 114 due in part to the close proximity of the lamphead 145 to the lower dome 114. The lamphead 145 may also cool the lamp walls and walls of the reflectors 143. If desired, the lampheads 145 may be in contact with the lower dome 114.

The substrate support 107 is shown in an elevated processing position, but may be moved vertically by an actuator (not shown) to a loading position below the processing position to allow lift pins 105 to contact the lower dome 114. The lift pins 105 pass through holes 111 in the substrate support 107 and raise the substrate 108 from the substrate support 107. A robot (not shown) may then enter the processing chamber 100 to engage and remove the substrate 108 therefrom through the loading port 103. A new substrate is placed on the substrate support 107, which then may be raised to the processing position to place the substrate 108, with upper surface 116 wherein devices mostly formed thereon facing up, in contact with a front side 110 of the substrate support 107.

The substrate support 107 disposed in the processing chamber 100 divides the internal volume of the processing chamber 100 into a process gas region 156 (above the front side 110 of the substrate support 107) and a purge gas region 158 (below the substrate support 107). The substrate support 107 is rotated during processing by a central shaft 132 to minimize the effects of thermal and process gas flow spatial non-uniformities within the processing chamber 100, and thus facilitate uniform processing of the substrate 108. The substrate support 107 is supported by the central shaft 132, which moves the substrate 108 in an up and down direction 134 during loading and unloading, and in some instances, during processing of the substrate 108. The substrate support 107 may be formed from a material having low thermal mass or low heat capacity, so that energy absorbed and emitted by the substrate support 107 is minimized. The substrate support 107 may be formed from silicon carbide or graphite coated with silicon carbide to absorb radiant energy from the lamps 102 and rapidly conduct the radiant energy to the substrate 108. In one embodiment, the substrate support 107 is shown in FIG. 1 as a ring having a central opening to facilitate exposure of the center of the substrate to the thermal radiation generated by the lamps 102. The substrate support 107 may support the substrate 108 from the edge of the substrate 108. In another embodiment, the substrate support 107 may also be a disk member that has no central opening. In yet another embodiment, the substrate support 107 may also be a disk-like or platter-like substrate support, or a plurality of pins extending from a respective finger, for example, three pins or five pins.

In one embodiment, the upper dome 128 and the lower dome 114 are formed from an optically transparent or translucent material such as quartz. The upper dome 128 and the lower dome 114 are thin to minimize thermal memory. In one embodiment, the upper dome 128 and the lower dome 114 may have a thickness between about 3 mm and about 10 mm, for example about 4 mm. The upper dome 128 may be thermally controlled by introducing a thermal control fluid, such as a cooling gas, through an inlet portal 126 into a thermal control space 136, and withdrawing the thermal control fluid through an exit portal 130. In some embodiments, a cooling fluid circulating through the thermal control space 136 may reduce deposition on an inner surface of the upper dome 128.

A liner assembly 162 may be disposed within the chamber body 101 and is surrounded by the inner circumference of the base plate 160. The liner assembly 162 may be formed from a process-resistant material and generally shields the processing volume (i.e., the process gas region 156 and purge gas region 158) from metallic walls of the chamber body 101. An opening 170, such as a slit valve, may be disposed through the liner assembly 162 and aligned with the loading port 103 to allow for passage of the substrate 108.

Process gas supplied from a process gas supply source 173 is introduced into the process gas region 156 through a process gas inlet port 175 formed in the sidewall of the base plate 160. Additional openings (not shown) may also be formed in the liner assembly 162 to allow gas to flow therethrough. The process gas inlet port 175 is configured to direct the process gas in a generally radially inward direction. During the film formation process, the substrate support 107 is located in the processing position, which is adjacent to and at about the same elevation as the process gas inlet port 175, thereby allowing the process gas to flow along flow path 169 defined across the upper surface 116 of the substrate 108. The process gas exits the process gas region 156 (along flow path 165) through a gas outlet port 178 located on the opposite side of the processing chamber 100 relative to the process gas inlet port 175. Removal of the process gas through the gas outlet port 178 may be facilitated by a vacuum pump 180 coupled thereto. As the process gas inlet port 175 and the gas outlet port 178 are aligned to each other and disposed approximately at the same elevation, it is believed that such a parallel arrangement will enable a generally planar, uniform gas flow across the substrate 108. Further radial uniformity may be provided by the rotation of the substrate 108 through the substrate support 107.

Purge gas supplied from a purge gas source 163 is introduced to the purge gas region 158 through a purge gas inlet port 164 formed in the sidewall of the base plate 160. The purge gas inlet port 164 is disposed at an elevation below the process gas inlet port 175. The purge gas inlet port 164 is configured to direct the purge gas in a generally radially inward direction. If desired, the purge gas inlet port 164 may be configured to direct the purge gas in an upward direction. During the film formation process, the substrate support 107 is located at a position such that the purge gas flows along flow path 161 across a back side 104 of the substrate support 107. Without being bound by any particular theory, the flowing of the purge gas is believed to prevent or substantially avoid the flow of the process gas from entering into the purge gas region 158, or to reduce diffusion of the process gas entering the purge gas region 158 (i.e., the region under the substrate support 107). The purge gas exits the purge gas region 158 (along flow path 166) and is exhausted out of the process chamber through the gas outlet port 178 located on the opposite side of the processing chamber 100 relative to the purge gas inlet port 164.

Similarly, during the purging process the substrate support 107 may be located in an elevated position to allow the purge gas to flow laterally across the back side 104 of the substrate support 107. It should be appreciated by those of ordinary skill in the art that the process gas inlet port, the purge gas inlet port and the gas outlet port are shown for illustrative purposes, since the position, size, or number of gas inlets or outlet port etc., may be adjusted to further facilitate a uniform deposition of material on the substrate 108.

A reflector 122 may be optionally placed outside the upper dome 128 or the lower dome 114 to reflect infrared light that is radiating from the substrate 108 or transmitted by the substrate 108 back onto the substrate 108. Due to the reflected infrared light, the efficiency of the heating will be improved by containing heat that could otherwise escape the processing chamber 100. The reflector 122 can be made of a metal such as aluminum or stainless steel. The reflector 122 can have the inlet portal 126 and exit portal 130 to carry a flow of a fluid such as water for cooling the reflector 122. If desired, the reflection efficiency can be improved by coating a reflector area with a highly reflective coating, such as a gold coating.

One or more thermal sensors 190 may be disposed in the lamphead 145 and upper dome 128 for measuring thermal emissions of the substrate 108. Each thermal sensor 190 includes a transmitter 191 and a receiver 192, and is coupled to at least one sensor controller 194. The thermal sensors 190 may be disposed at different locations in the lamphead 145 to facilitate viewing (i.e., sensing) different locations of the substrate 108 during processing. In one embodiment, the thermal sensors 190 are disposed on a portion of the chamber body 101 below the lamphead 145. Sensing the temperature from different locations of the substrate 108 facilitates determining whether temperature anomalies or non-uniformities are present. Such temperature non-uniformities can result in non-uniformities in film formation, such as thickness and composition. Although one thermal sensor 190 (comprising the transmitter 191 and receiver 192) is illustrated in FIG. 1, one or more additional thermal sensors 190 may be utilized for obtaining an edge to edge temperature profile of the substrate 108. It is contemplated that the thermal sensors 190 may be arranged to determine the temperature at a plurality of predefined locations of the substrate 108.

For example, each thermal sensor 190 may be positioned and/or oriented to view a zone of the substrate 108 and sense the thermal state of that zone. The zones of the substrate 108 may be oriented radially in some embodiments. For example, in embodiments where the substrate 108 is rotated, the thermal sensors 190 may view, or define, a central zone in a central portion of the substrate 108 having a center substantially the same as the center of the substrate 108, with one or more zones surrounding the central zone and concentric therewith. However, it is not required that the zones be concentric or radially oriented. In some embodiments, zones may be arranged at different locations of the substrate 108 in non-radial fashion, for example in a Cartesian grid arrangement.

The transmitter 191 of the thermal sensors 190 may be disposed between the lamps 102, for example in the channels 149, and are oriented substantially obliquely to the upper surface 116 of the substrate 108. In some embodiments the transmitter 191 and the receiver 192 are oriented obliquely to the substrate 108 at a substantially similar angle. In other embodiments, the transmitter 191 and the receiver 192 may be oriented in slight departure from each other. For example, the transmitter 191 and the receiver 192 may have an orientation angle within about 5° of each other.

During processing, a controller 182 receives a metric indicative of temperature from the thermal sensors 190 (or from the sensor controller 194) and separately adjusts the power delivered to each lamp 102, or individual groups of lamps or lamp zones, based on the metric. The controller 182 may include a power supply 184 that independently powers the various lamps 102 or lamp zones. The controller 182 may also include the sensor controller 194. The controller 182 can be configured to produce a desired temperature profile on the substrate 108, and based on comparing the metric received from the thermal sensors 190 to a predefined temperature profile or target set point, the controller 182 may adjust the power to lamps and/or lamp zones to conform the observed (i.e., sensed) thermal information indicating of the lateral temperature profile of the substrate with to the desired temperature profile. The controller 182 may also adjust power to the lamps and/or lamp zones to conform the thermal treatment of one substrate to the thermal treatment of another substrate, to prevent chamber performance drift over time.

The thermal sensor 190 may operate to detect the temperature on the substrate 108. For example, the sensor controller 194 may instruct the transmitter 191 to send a transmitted signal 146. The transmitted signal 146 may interact with the substrate 108, or other bodies, which may modify, attenuate, or alter the transmitted signal 146. A received signal 147 (the transmitted signal 146 which has been altered) is directed away from the substrate 108 to the receiver 192. The receiver 192 then conveys the received signal 147 to the sensor controller 194. The sensor controller 194 may compare the transmitted signal 146 to the received signal 147 to determine a temperature. The thermal sensor 190 is discussed in greater detail in FIG. 2.

Figure 2:
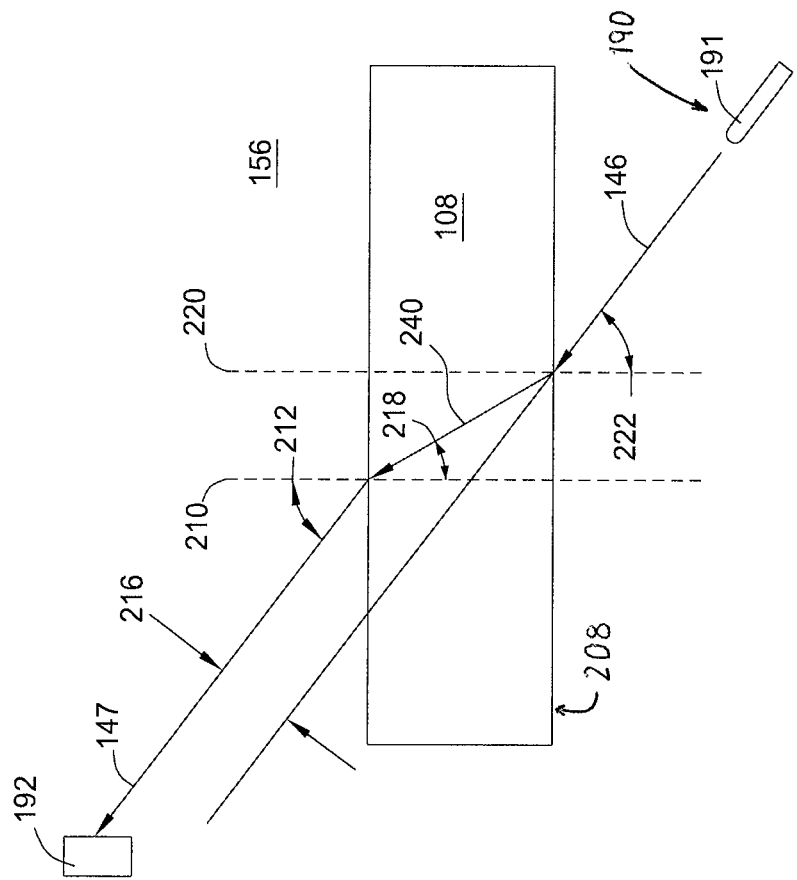
FIG. 2 is a schematic sectional view of the thermal sensor shown in the processing chamber of FIG. 1.

FIG. 2 is a schematic sectional view of the thermal sensor 190 shown in the processing chamber of FIG. 1. Although one or more transmitters 191 may direct one or more transmitted signals 146 at either the upper surface 116 of the substrate 108, an underside 208 of the substrate 108, or a combination thereof, the mechanics are similar and the discussion will be in reference a single transmitter. That is, the transmitter 191 directs the transmitted signal 146 at the underside 208 of the substrate 108 at a first angle 222 from a normal angle 210, 220 to the underside 208 of the substrate 108. The transmitted signal 146 is altered by the substrate 108, such as by changing the first angle 222 of the signal by diffraction to an intermediate angle 218, as shown by an intermediary signal 240 propagating through the substrate 108. The intermediate angle 218 may be dependent on the properties of the substrate 108 as well as the temperature of the substrate 108. The properties of the substrate along with the intermediate angle 218 generate a displacement 216 of the signals 146, 147. The intermediary signal 240 exits the upper surface 116 of the substrate 108, where it may diffract again to a second angle 212, as the received signal 147 which is then detected by the receiver 192. In one embodiment, the first angle 222 and the second angle 212 are substantially similar. In a second embodiment, the first angle 222 and the second angle 212 are dissimilar.

The thermal sensor 190 may work on one or more principles associated with the transmission of electromagnetic waves. The thermal sensor 190 may utilize the properties of the substrate 108 to effect a change in the transmitted signal 146. The properties creates the displacement 216 from the transmitted signal 146 to the received signal 147 which is temperature dependent, and accordingly, may be used to determine the temperature of the substrate 108. In one embodiment, a temperature of the substrate 108 can be detected as a function of the change in refraction and density of the substrate 108. For example, silicon has a density of about 2.3290 g·cm$^3$ at 0° C. and about 2.57 g·cm$^3$ at 1414° C. The electromagnetic waves change in velocity and refract when the waves pass through a medium, such as the substrate 108, and vary with the dynamic density of the substrate 108. Thus, the change in the transmission signal may be indicative of the change in density of the substrate 108, which can then be correlated to a temperature of the substrate 108. Additionally, measuring the speed of the transmitted signal 146 affected by the density of the substrate 108 as it propagates through the substrate 108 may also be used to yield information about the temperature of the substrate 108. In another embodiment, the electromagnetic waves may determine an electromagnetic field of the substrate 108. Changes in the electromagnetic field of the substrate correlate to changes in the temperature of the substrate 108.

The thermal sensors 190 may be attuned to the same wavelength or spectrum, or to different wavelengths or spectra. For example, substrates used in the processing chamber 100 may be compositionally homogeneous, or they may have domains of different compositions, such as feature locations. Using thermal sensors 190, attuned to different wavelengths, may allow monitoring of substrate domains having different composition and different emission responses to thermal energy.

Although sound waves do not travel through a vacuum, radio waves are electromagnetic waves that are capable of traveling through a vacuum. Sound consists of pressure variations in matter, such as air or water and therefore will not travel through a vacuum. However, radio waves, like visible light, infrared, ultraviolet, X-rays and gamma rays, are electromagnetic waves that readily travel through a vacuum, making radio waves well suited for vacuum environments such as a plasma processing chamber and the like.

In one embodiment, the thermal sensors 190 are attuned to infrared wavelengths, such as 700 nanometers to 1 mm, for example at about 3 µm. The thermal sensors 190 may generate a continuous wave, such as a sinusoidal wave. However, it should be understood that any suitable wave, such as a pulsing wave. Pulsing waves may beneficially have less noise, making pulsing waves desirable for use in the thermal sensor 190. For example, a pulse wave may measure time variation from the transmitter to the receiver for the pulse wave and compare the time variations against various substrate temperatures.

The actual speed of an electromagnetic wave through a material medium is dependent upon the density of that medium. Different materials cause a different amount of delay due to the absorption and reemission process of the electromagnetic wave. Different materials have atoms more closely packed and thus the amount of distance between atoms is also less. The variation of the density for the substrate 108 is dependent upon the nature of the material as well as certain properties, such as temperature, of the substrate 108. Additionally, the speed of an electromagnetic wave is dependent upon the material and its density through which it is traveling. The speed of the electromagnetic wave changes gradually over a given distance. Thus, we can detect temperature as a function of change in refraction and density of the substrate 108 by analyzing the variation from input to output of an electromagnetic wave. The temperature can be validated at a particular point by comparing the change of frequency and speed along with refraction as a function of temperature.

For example, the speed of a sound wave is about 343 m/s or about 767 mph in dry air maintained at 20° C. The speed of the wave depends on the temperature of the medium, i.e., air or substrate. The speed of sound in are may be expressed as: v=331 m/s+0.6 T; where v is the velocity of the wave, T is the temperature of the air in degrees Celsius, 331 m/s is the speed of sound in dry air at 0° C., and 0.6 is a constant. So as the temperature increases, so does the speed of sound at a rate of 0.6 m/s for each Celsius degree. The speed of sound also depends on the compressibility and inertia of the medium. The variation on speed due to compressibility of the medium can be represented as v2=(elastic property/inertial property). Where the elastic property is usually the bulk modulus or Young's modulus of the medium, and the inertial property is the density of the medium. These same principles can be applied to electromagnetic waves to measure the temperature of a substrate in a vacuum atmosphere.

In another embodiment, a temperature of the substrate 108 can be determined using the sensor 190 configured to detect magnetic susceptibility. Using the Curie-Weiss Law, the magnetic fielded variation may be used to measure in the temperature of the substrate 108. Magnetic susceptibility is inversely proportional to the temperature of the substrate through which the magnetic field is measured. Thus, measuring the magnetic field at the substrate 108 is indicative of a measured temperature.

The transmitter 191, in one embodiment, may be in the form of magnets placed beneath the substrate. The receivers 192, one embodiment, may be in the form of a sensor for measuring the magnetic susceptibility of the substrate 108 using the field provided by the transmitter 191. The magnets (i.e., the transmitters 191) may be placed in the reflector plate or below and controlled and isolated with respect to the magnetic field of the substrate. Changes in the substrate 108 magnetic field can be expressed as a function of temperature using Curie's Law, i.e., $\chi=M/H=M\mu_0/B=C/T$. Where $\chi$ is the magnetic susceptibility which is the influence of an applied magnetic field on the substrate 108; M is the magnetic moment per unit volume, H is the macroscopic magnetic field, $\mu_0$ is the permeability of free space; B is the magnetic field; C is the material-specific Curie constant; and T is the temperature (of a substrate).

The thermal sensors 190 may have different embodiments for different temperature ranges and operating conditions. In one embodiment, the thermal sensor 190 may be configured for general purposes and operable at temperatures of between about 250° C. (500° F.) and about 2500° C. (4500° F.). The general purpose thermal sensor may be comprised of narrow spectral band radiation thermometers operating at wavelengths of about 0.65 μm; or between about 0.7 μm and about 1.1 μm; or between about 0.9 μm and about 1.9 μm. The general purpose thermal sensors may have solid-state photoelectric detectors, such as Si or Ge among others, an optical resolution of about 0.9 mm diameter, and a distance-ratio (D-ratio) of about 250:1.

In another embodiment, the thermal sensor 190 may be a high-precision thermal sensor having a two-color ratio pyrometer. The two colors represent two discrete wavelengths used for the thermal measurement. The high-precision thermal sensor may be used for temperatures between about 650° C. (1200° F.) and about 2500° C. (4500° F.). The high-precision thermal sensor may operate with spectral bands for the two colors of about 0.8 μm and about 0.9 μm. Advantageously, the high-precision thermal sensor is independent of emissivity, fluctuations and/or sight path disturbances, and automatically compensates for moving targets.

In yet another embodiment, the thermal sensor 190 may be a programmable/high-performance thermal sensor. The programmable/high-performance thermal sensor may be used for temperatures between about 100° C. (212° F.) and about 2500° C. (4500° F.). The programmable/high-performance thermometer may have built-in signal conditioning and digital computing, spectral band choices in wide or narrow bands between about 2 μm and about 20 μm, a bidirectional interface, a plurality of programmable functions such as maximum/minimum/differential/hold, programmable ambient temperatures for a plurality of different material compositions, and a choice of through-lens-sighting, such as LED or laser.

In yet another embodiment, the thermal sensor 190 may be a high temperature general purpose thermal sensor. The high temperature general purpose thermal sensor may be used for temperatures between about 250° C. (500° F.) and about 2500° C. (4500° F.). The high temperature general purpose thermal sensor may operate in a narrow spectral band such as about 0.65 μm; or about 0.7-1.1 μm; or about 0.9-1.9 μm. The high temperature general purpose thermal sensor may have solid-state photoelectric detectors, such as Si or Ge, an optical resolution 0.9 mm diameter, and a D-ratio of about 250:1.

In yet another embodiment, the thermal sensor 190 may be a high-stability thermal sensor. The high-stability thermal sensor may be operable for complex applications at temperatures between about 300° C. (600° F.) and about 2500° C. (4500° F.). The high-stability thermal sensor may consist of one or more narrow spectral band radiation thermometers. For example, the high-stability thermal sensor may operate in a spectral band of about 3.9 μm for glass and/or through hot gas, in a spectral band of about 5.0 μm for glass surfaces, in a spectral band of between about 4.2 μm and about 5.3 μm for combustion gases; among other selected spectral bands. The high-stability thermal sensor may have a pyroelectric detector, is chopper stabilized, and have an optical resolution suitable for a 1 mm target as a 100:1 D-ratio. The high-stability thermal sensor has a response time of about 30 msec and may have an analog output of about 4 mA to about 20 mA.

In yet another embodiment, the thermal sensor 190 may be a high-speed, two-color ratio thermal sensor. The high-speed, two-color ratio thermal sensor may be operable at temperatures between about 150° C. (300° F.) and about 2500° C. (4500° F.). The high-speed, two-color ratio thermometer may have narrow spectral bands such as between about 0.8 μm and about 2.1 for a first band and between about 0.9 μm and about 2.4 μm for a second band. The high-speed, two-color ratio thermal sensor may additionally have an internal calibration check. Advantageously, the high-speed, two-color ratio thermal sensor is greatly independent of emissivity, fluctuations and/or sight path disturbances, and automatically compensates for moving targets.

While the foregoing is directed to embodiments of the invention, other and further embodiments of the invention may be devised without departing from the basic scope thereof.

What is claimed is:

1. A thermal sensor, comprising:
   a transmitter configured to transmit electromagnetic waves to a near side of a substrate;
   a receiver configured to receive an electromagnetic waves refracted within and through the substrate from a far side of the substrate, the received electromagnetic waves having a displacement from the transmitted electromagnetic waves; and
   a controller configured to control the transmitter and receiver, wherein the controller is configured to cause the transmitter to transmit the electromagnetic waves toward the near side of the substrate at a measured initial position, wherein the controller is further configured to measure the displacement of the refracted electromagnetic waves received from the receiver from the far side of the substrate at a second measured position relative to the initial position, wherein the controller is operable to determine a temperature from the measured displacement between the transmitted electromagnetic waves and the received refracted electromagnetic waves.

2. A processing chamber, comprising:
   a chamber body;
   a substrate support disposed in an internal volume of the chamber body;
   a transmitter oriented to transmit an electromagnetic wave through a near side of a substrate disposed on the substrate support;
   a receiver oriented to receive a electromagnetic wave refracted within and through the substrate from a far side of the substrate and emitted by the transmitter, the received electromagnetic wave having a displacement from the transmitted electromagnetic wave; and
   a controller configured to control the transmitter and receiver, wherein the controller is configured to cause the transmitter to transmit the electromagnetic wave toward the near side of the substrate at a measured initial position, wherein the controller is further configured to measure the displacement of the refracted electromagnetic waves received from the receiver from the far side of the substrate at a second measured position relative to the initial position, wherein the controller is operable to determine a temperature from a magnetic fielded variation of the transmitted electromagnetic wave and the received electromagnetic wave wherein the magnetic fielded variation is the measured displacement between the transmitted electromagnetic wave and the received refracted electromagnetic wave.

3. A method for non-contact measurement of a temperature of a substrate disposed in a processing chamber, the method comprising:
   transferring a substrate into a processing chamber;

directing an electromagnetic wave through a near side of the substrate at a measured initial position disposed in the processing chamber;

receiving an electromagnetic wave after the directed electromagnetic wave has refracted within and through the substrate from a far side of the substrate at a second measured position relative to the initial position; and determining a temperature of the substrate based on a metric indicative of a change between the directed electromagnetic wave and the refracted received electromagnetic wave wherein the change is measured displacement of the second measured position relative to the initial position between the directed electromagnetic wave and the received refracted electromagnetic wave.

4. The thermal sensor of claim 1, wherein the controller, when determining the difference between the transmitted electromagnetic wave and the received electromagnetic wave, is operable to determine the temperature as a function of a change in speed of the received electromagnetic wave.

5. The processing chamber of claim 2, wherein the chamber body comprises:
a lower dome;
an upper dome; and
an array of radiant heating lamps arranged to heat a substrate disposed on the substrate support through the lower dome.

6. The thermal sensor of claim 2, wherein the transmitter and the receiver are oriented obliquely to a substrate supporting surface of the substrate support.

7. The thermal sensor of claim 2, wherein the transmitter and the receiver are oriented within about 5 degrees of each other.

8. The method of claim 3 further comprising:
annealing the substrate in the processing chamber; or
depositing on the substrate a material selected from the group consisting of a group III material, group IV material, a group V material, and a material which includes a group III material dopant, a group IV material dopant, and group V material dopant.

* * * * *